United States Patent
Yaguchi

(10) Patent No.: US 8,583,388 B2
(45) Date of Patent: Nov. 12, 2013

(54) POWER INTEGRITY ANALYZER, POWER INTEGRITY ANALYSIS METHOD, AND PROGRAM

(75) Inventor: Takahiro Yaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 467 days.

(21) Appl. No.: 12/834,059

(22) Filed: Jul. 12, 2010

(65) Prior Publication Data

US 2011/0015883 A1 Jan. 20, 2011

(30) Foreign Application Priority Data

Jul. 16, 2009 (JP) .................... 167667/2009

(51) Int. Cl.
*G01R 21/00* (2006.01)
*G01R 27/00* (2006.01)
*G06F 17/50* (2006.01)

(52) U.S. Cl.
USPC .............................. 702/60; 324/600; 716/133

(58) Field of Classification Search
USPC ........... 702/60, 57, 64–67, 70–73, 75–76, 79, 702/81, 84–85, 106, 127, 182–183, 189; 324/76.11–76.12, 76.19, 76.39, 76.69, 324/600, 612–613, 620, 76.11–76.12, 324/76.22, 76.11–76.12; 716/132–133, 716/136–137
See application file for complete search history.

(56) References Cited

U.S. PATENT DOCUMENTS

2007/0057380 A1* 3/2007 Katagiri et al. ............... 257/778

FOREIGN PATENT DOCUMENTS

| JP | 2005157801 A |   | 6/2005 |
|----|--------------|---|--------|
| JP | 2005221487 A | * | 8/2005 |
| JP | 2006163494 A |   | 6/2006 |
| JP | 2007065765 A | * | 3/2007 |
| JP | 2007207168 A |   | 8/2007 |
| JP | 2009140216 A |   | 6/2009 |

OTHER PUBLICATIONS

Yan et al., Guiding Power Delivery Design with Chip-Package Information Using Allegro PCB SI Power Integrity Option, 2007, Cadence Designer Network, Presented at Silicon Valley 2007, 13 pp.*
JP 2007065765A, Mar. 2007, 24 pp.*
JP 2005221487A, Aug. 2005, 12 pp.*
L. Smith et al., "Power Distribution System Design Methodology and Capacitor Selection for Modern CMOS Technology"; IEEE Transactions on Advanced Packaging vol. 22, No. 3, Aug. 1999.
Japanese Office Action for JP2009-167667 issued Apr. 12, 2011.

* cited by examiner

*Primary Examiner* — Toan Le

(57) ABSTRACT

A power integrity analyzer according to an exemplary aspect of the invention includes a parameter inputting unit that inputs parameters to a power-supply current waveform which indicates a variation of a power-supply current value on a time axis of an element, a conversion unit that converts the power-supply current waveform which indicates a variation on the time axis determined by the parameter to a power-supply current spectrum which indicates a variation of the power-supply current value on a frequency axis, an allowable value information storage unit that stores an allowable power-supply voltage fluctuation value of the element, and an impedance calculating unit that calculates a target impedance spectrum on the device indicating the variation of impedance value on the frequency axis based on the power-supply current spectrum and the allowable power-supply voltage fluctuation value.

16 Claims, 14 Drawing Sheets

Fig.4

1201 POWER-SUPPLY CURRENT WAVE INFORMATION

| STEADY-STATE POWER-SUPPLY CURRENT VALUE | 2 MILLIAMPERE |
|---|---|
| ISOSCELES TRIANGULAR WAVE HEIGHT | 10 MILLIAMPERE |
| ISOSCELES TRIANGULAR WAVE BASE | 2 NANOSECONDS |
| ISOSCELES TRIANGULAR WAVE CYCLE | 5 NANOSECONDS |
| CYCLE | 10 NANOSECONDS |

Fig.5

1301 POWER-SUPPLY CURRENT SPECTRUM

| | |
|---|---|
| ⋮ | ⋮ |
| 98 MEGAHERTZ | 0 MILLIAMPERE |
| 99 MEGAHERTZ | 1 MILLIAMPERE |
| 100 MEGAHERTZ | 10 MILLIAMPERE |
| 101 MEGAHERTZ | 1 MILLIAMPERE |
| 102 MEGAHERTZ | 0 MILLIAMPERE |
| ⋮ | ⋮ |

Fig.6

1401 TARGET IMPEDANCE SPECTRUM

| | |
|---|---|
| ⋮ | ⋮ |
| 98 MEGAHERTZ | 0.00 OHM |
| 99 MEGAHERTZ | 0.75 OHM |
| 100 MEGAHERTZ | 7.50 OHM |
| 101 MEGAHERTZ | 0.75 OHM |
| 102 MEGAHERTZ | 0.00 OHM |
| ⋮ | ⋮ |

Fig.7

ALLOWABLE VALUE INFORMATION STORAGE UNIT (180)

1802 ALLOWABLE POWER-SUPPLY VOLTAGE FLUCTUATION SPECTRUM

| | |
|---|---|
| ⋮ | ⋮ |
| 98 MEGAHERTZ | 0.075 VOLT |
| 99 MEGAHERTZ | 0.075 VOLT |
| 100 MEGAHERTZ | 0.075 VOLT |
| 101 MEGAHERTZ | 0.075 VOLT |
| 102 MEGAHERTZ | 0.075 VOLT |
| ⋮ | ⋮ |
| 199 MEGAHERTZ | 0.080 VOLT |
| 200 MEGAHERTZ | 0.080 VOLT |
| 201 MEGAHERTZ | 0.080 VOLT |
| ⋮ | ⋮ |

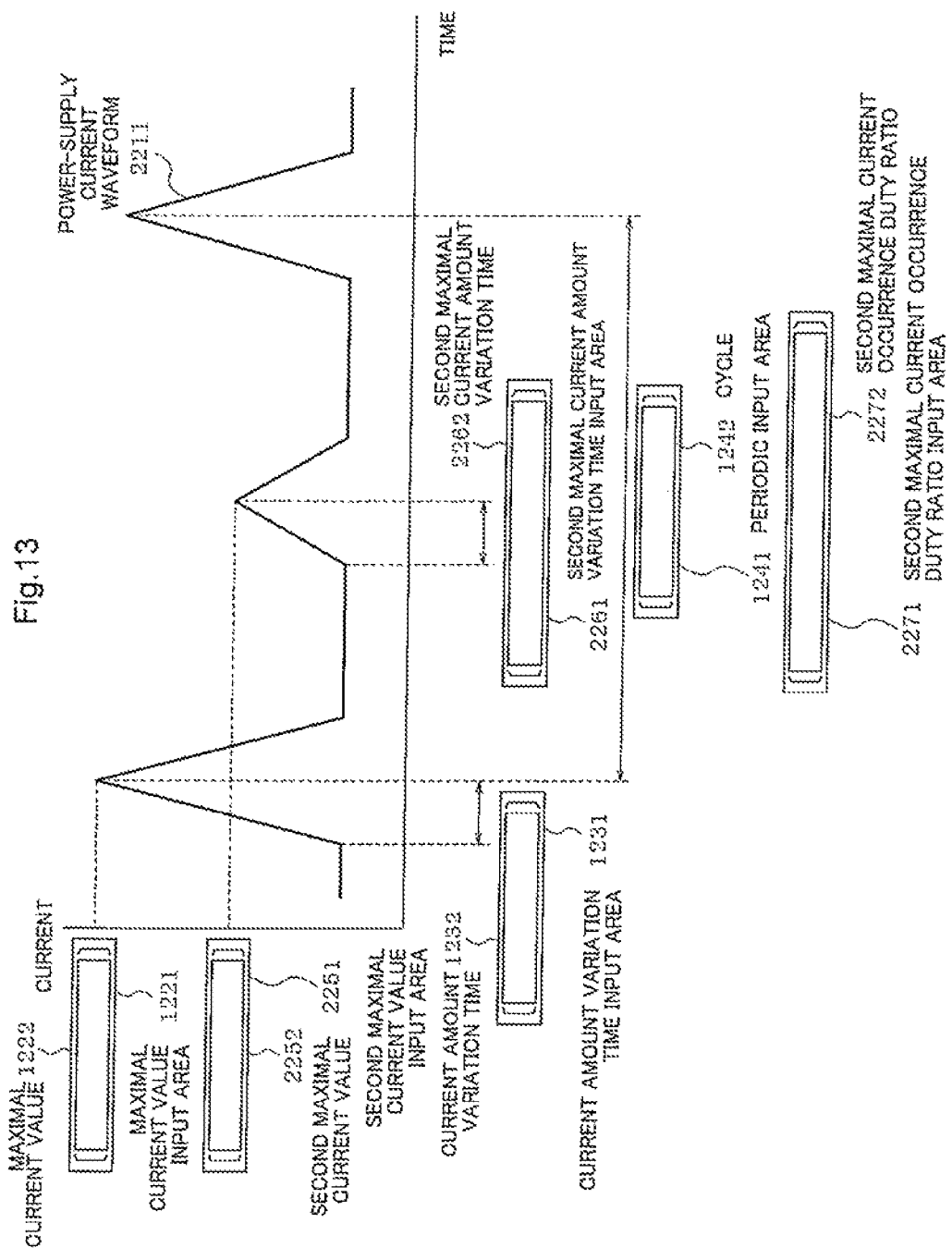

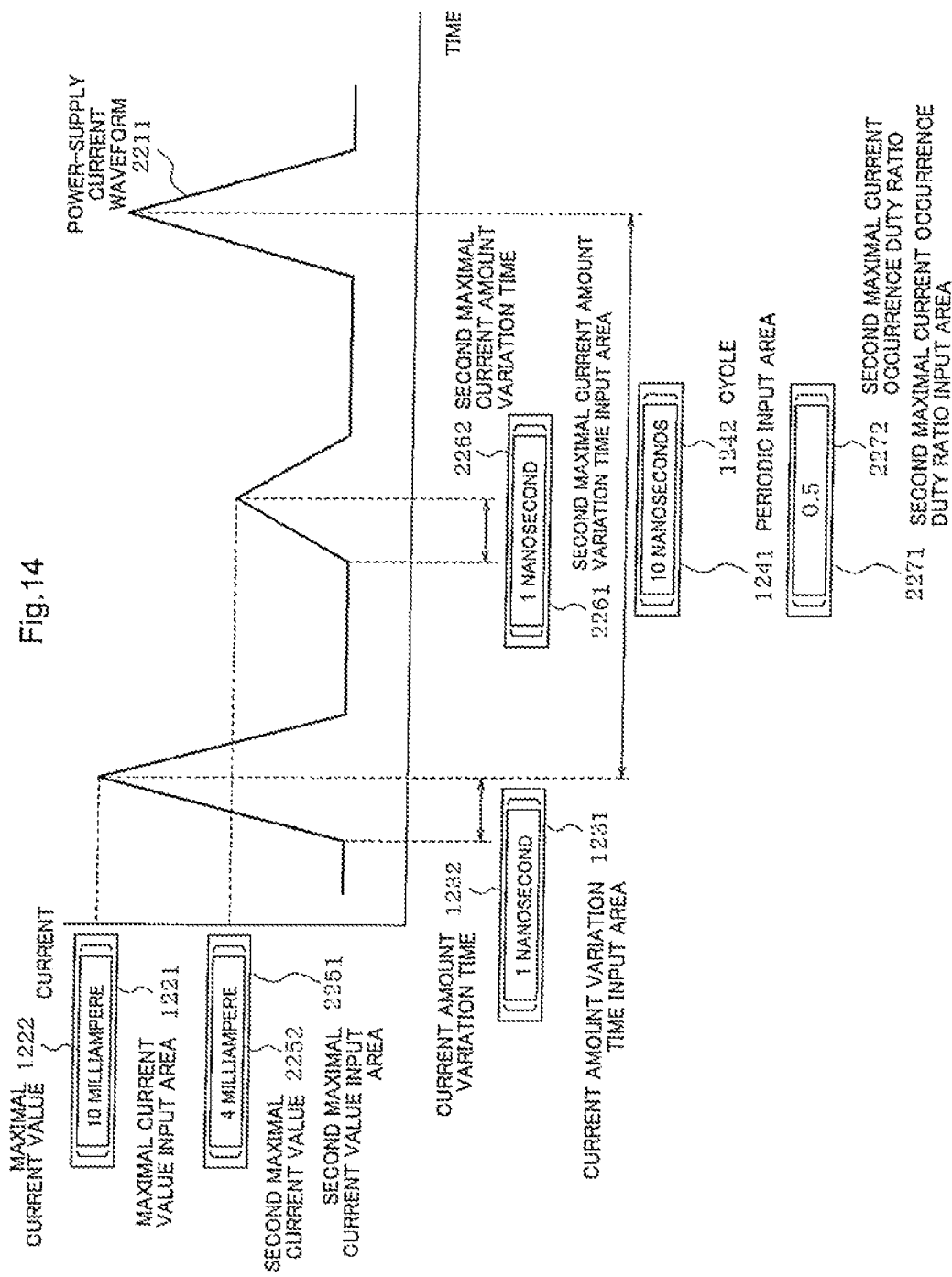

Fig.15

2201 POWER-SUPPLY CURRENT WAVE INFORMATION

| STEADY-STATE POWER-SUPPLY CURRENT VALUE | 2 MILLIAMPERE |
|---|---|
| FIRST ISOSCELES TRIANGULAR WAVE HEIGHT | 10 MILLIAMPERE |
| FIRST ISOSCELES TRIANGULAR WAVE BASE | 2 NANOSECONDS |
| FIRST ISOSCELES TRIANGULAR WAVE CYCLE | 10 NANOSECONDS |
| SECOND ISOSCELES TRIANGULAR WAVE HEIGHT | 4 MILLIAMPERE |
| SECOND ISOSCELES TRIANGULAR WAVE BASE | 2 NANOSECONDS |
| SECOND ISOSCELES TRIANGULAR WAVE CYCLE | 5 NANOSECONDS |
| CYCLE | 10 NANOSECONDS |

POWER INTEGRITY ANALYZER, POWER INTEGRITY ANALYSIS METHOD, AND PROGRAM

This application is based upon and claims the benefit of priority from Japanese Patent Application No. 2009-167667, filed on Jul. 16, 2009, the disclosure of which is incorporated herein in its entirety by reference.

TECHNICAL FIELD

The present invention relates to a power integrity analyzer, a power integrity analysis method, and a program. More particularly, the present invention relates to a calculation of target impedance.

BACKGROUND ART

In order to obtain a stable normal operation in a circuit including LSI (Large Scale Integration) and the like, it is important to have a power integrity measure in a general electronic circuit. For example, the following measure is considered. That is, to have a voltage not to fluctuate above a certain level between a supply terminal of LSI or of a semiconductor chip and an earth terminal, the impedance between the supply terminal of LSI or of the semiconductor chip and the earth terminal is kept below a certain value. This certain value (the upper limit) is called the target impedance.

In a design using a power integrity analysis system, the target impedance is specified first. Then, in a design of a printed-wiring board or an IC (Integrated Circuit) package, the impedance of these design objects is considered not to exceed the above-mentioned target impedance.

An example of a method to obtain the above-mentioned target impedance is disclosed in the following document 1.

Document 1: Smith, Larry D. et al. (August 1999) Power Distribution System Design Methodology and Capacitor Selection for Modern CMOS Technology. *IEEE Transactions On Advanced Packaging* 22 (3): 284-291.

The method disclosed in document 1 is a method for calculating target impedance based on the following formula.

target impedance=(power-supply voltage value)×(fluctuating allowable value)/amount of LSI consumption current In addition, there is a necessity for the target impedance to be expressed in a frequency spectrum and the amount of LSI consumption current will be expressed in frequency spectrum. That is, when in practical use, the above-mentioned formula is transformed into a Figure corresponding to the frequency spectrum. Further, the amount of LSI consumption current is represented by an instantaneous maximal current or an average amount of consumption current or the like. Furthermore, the target impedance to be evaluated will be changed whether to use the maximal current or the average current.

With the points hereof in consideration, a design method of a semiconductor device which realizes power integrity based on a calculation method of the target impedance disclosed in the document 1, is disclosed in Japanese Patent Laid-Open No. 2007-065767 (document 2).

Document 2 teaches the art of obtaining target impedance by converting known semiconductor chip characteristics or IC package characteristics and printed-wiring board characteristics to a frequency spectrum by analyzing on the time axis. Further, the design method in document 2 has a step to select one voltage fluctuation spectrum from a plurality of types of voltage fluctuation spectrum as a providing means of target impedance.

Moreover, document 2 discloses a design support system to support a design according to the above-mentioned design method. The design support system includes an adjustment target system information input unit, an adjustment target value calculation processing unit, a constraint value providing unit, a design support information determination unit, and a display unit. The adjustment target system information input unit inputs adjustment target system information of the adjustment target system which includes electrical paths in semiconductor package whereas not including semiconductor chip. The adjustment target value calculation processing unit calculates an adjustment target value of the adjustment target system being represented in a frequency domain based on the adjustment target system information. The constraint value providing unit provides a constraint value which is predetermined within the frequency domain. The design support information determination unit compares the constraint value and the adjustment target value, and determines design support information when having a section of the adjustment target value corresponding to the frequency region at which the adjustment target system exceeds the constraint value as an adjustment target section. The display unit displays the design system information.

Japanese Patent Laid-Open No. 2005-221487 (document 3) discloses a device for measuring internal impedance of a secondary battery. The device for measuring internal impedance disclosed in document 3 first obtains a number of measurement values on a time axis by having an actual measurement of input current and responsive voltage of the secondary battery, then have Fourier transformation applied to the input current and to the responsive voltage. Further, the device for measuring internal impedance evaluates each frequency component of the input current and the responsive voltage in a determined frequency, and calculates the internal impedance of the secondary battery in the determined frequency by measuring the ratio thereof.

An evaluation device for an integrated circuit device is disclosed in WO2006/109750 (document 4). The evaluation device disclosed in document 4 has an equivalent circuit creation unit, an analysis unit, and a frequency-axis/time-axis conversion unit. The evaluation device operates as follows. First, the equivalent circuit creation unit inputs a detailed composition and characteristics information of the integrated circuit device of an evaluated target, and based on the input information, creates an equivalent circuit of the integrated circuit device. Further, the equivalent circuit creation unit inputs a power-supply behavior when switching in an active circuit element of the integrated circuit device as a form of time-axis data, and converts the above to frequency axis data. Subsequently, the analysis unit calculates a power-supply voltage of each frequency by analyzing the equivalent circuit on the frequency-axis using frequency-axis data. Then, the frequency-axis/time-axis conversion unit converts the frequency-axis data which represents the power-supply voltage of each frequency to the time-axis data.

SUMMARY

The object of the present invention is to provide a power integrity analyzer, a power integrity analysis method and a program which can calculate appropriate target impedance when performing power integrity analysis under circumstances of not being able to obtain actual measurement information or detailed operation characteristic information of LSI or a semiconductor chip as when the initial stage of device designing.

A power integrity analyzer according to an exemplary aspect of the invention includes a parameter inputting unit that inputs parameters to a power-supply current waveform which indicates a variation of a power-supply current value on a time axis of an element, a conversion unit that converts the power-supply current waveform which indicates a variation on the time axis determined by the parameter to a power-supply current spectrum which indicates a variation of the power-supply current value on a frequency axis, an allowable value information storage unit that stores an allowable power-supply voltage fluctuation value of the element, and an impedance calculating unit that calculates a target impedance spectrum on the device indicating the variation of impedance value on the frequency axis based on the power-supply current spectrum and the allowable power-supply voltage fluctuation value.

A power integrity analysis method according to an exemplary aspect of the invention, comprising: inputting a parameter corresponding to a power-supply current waveform which indicates a variation of a power-supply current value on a time axis of an element from an input unit, converting the power-supply current waveform which indicates a variation of the power-supply current value on the time axis determined by the parameter to a power-supply current spectrum indicating a variation of the power-supply current value on a frequency axis, storing an allowable power-supply voltage fluctuation value of the element in a storage unit in advance, calculating a target impedance spectrum of the element which indicates a variation on impedance value on the frequency axis based on the power-supply current spectrum and the allowable power-supply voltage fluctuation value, and outputs the calculated target impedance spectrum to an output unit.

A recording medium according to an exemplary aspect of the invention recording a program having the computer to implement, wherein it is a program having the computer to implement, an input process that inputs a parameter to a power-supply current waveform which indicates variation of a power-supply current value on a time axis of an element from an input unit, a conversion process that converts the power-supply current waveform which indicates a variation of the power-supply current value on the time axis determined by the parameter to a power-supply current spectrum which indicates a variation of the power-supply current value on a frequency axis, a storage process that stores allowable power-supply voltage fluctuation value of the element in a storage unit in advance, and a calculation process that calculates a target impedance spectrum of the element which indicates the variation of impedance value on the frequency axis based on the power-supply current spectrum and the allowable power-supply voltage fluctuation value, and output process that outputs the calculated target impedance spectrum to an output unit.

BRIEF DESCRIPTION OF THE DRAWINGS

Exemplary features and advantages of the present invention will become apparent from the following detailed description when taken with the accompanying drawings in which:

FIG. 4 is a diagram showing a structure of power-supply current wave information of the first to the third exemplary embodiment;

FIG. 5 is a diagram showing a structure of a power-supply current spectrum of the first to the third exemplary embodiment;

FIG. 6 is a diagram showing a structure of a target impedance spectrum of the first to the third exemplary embodiment;

FIG. 7 is a diagram showing a structure of an allowable power-supply voltage fluctuation spectrum of the first to the third exemplary embodiment;

FIG. 13 is a display example of an operation entry screen of the second exemplary embodiment;

FIG. 14 is a display example of an operation entry screen of the second exemplary embodiment.

FIG. 15 is a diagram showing a composition of power-supply current wave information of the second exemplary embodiment.

EXEMPLARY EMBODIMENT

Figure 1:
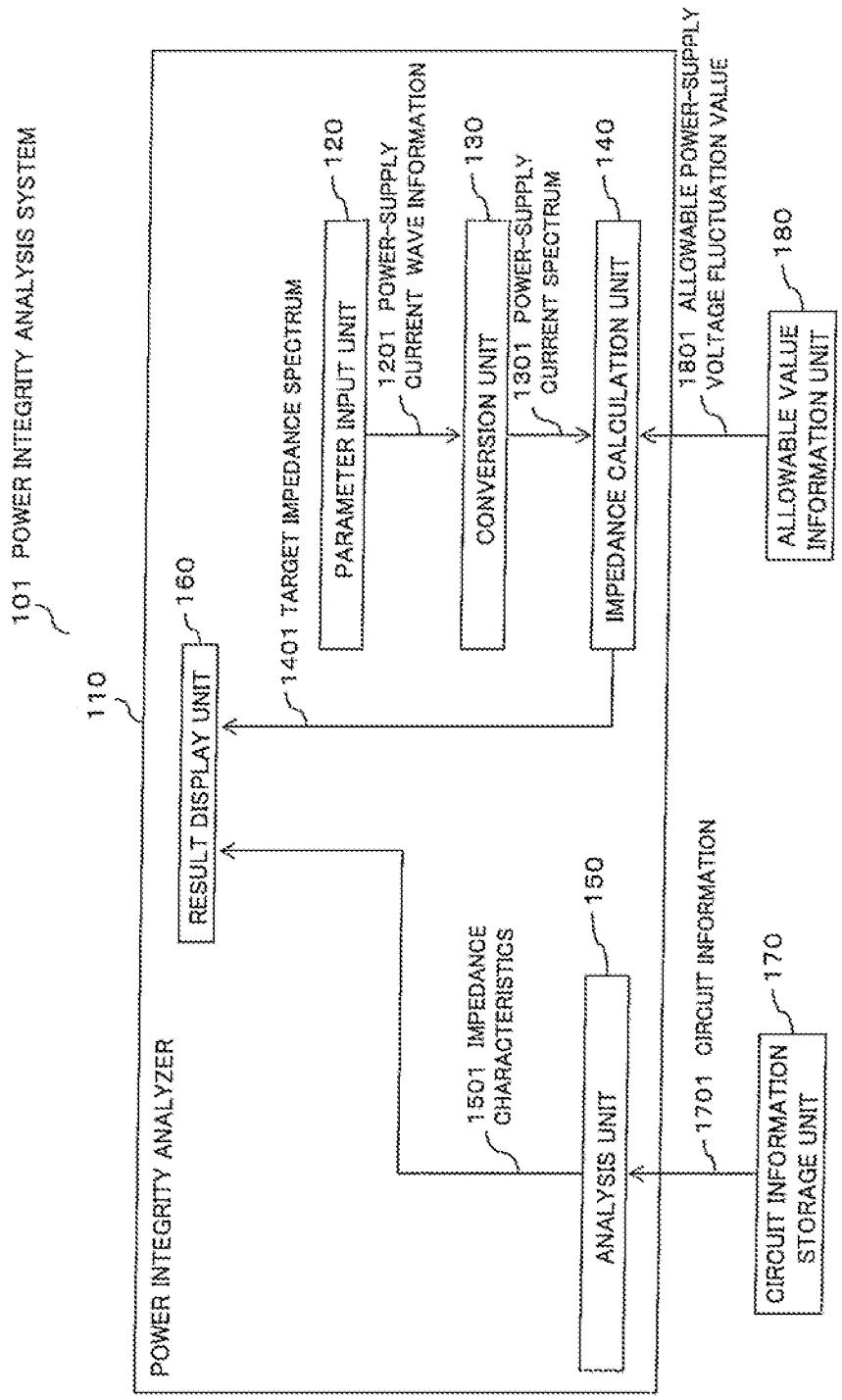
FIG. 1 is a block diagram showing a composition of a first exemplary embodiment.

Next, a first exemplary embodiment will be described in detail referring to the drawings.

FIG. 1 is a block diagram showing a composition of power integrity analysis system 101 in accordance with the first exemplary embodiment.

Referring to FIG. 1, power integrity analysis system 101 includes power integrity analyzer 110, circuit information storage unit 170, and allowable value information storage unit 180.

Power integrity analyzer 101 generates impedance characteristics 1501 of a power integrity analysis target circuit as well as calculating target impedance spectrum information (hereinafter, simply referred to as target impedance spectrum) 1401, and outputs both as a result of a power integrity analysis.

Power integrity analyzer 110 is realized by a computer including CPU (Central Processing Unit), storage device, and an input-output device and the like, and is realized by a program operating on the computer. In that case, the computer, for example, may be a server, an engineering workstation, or a personal computer or the like. Further, power integrity analyzer 110, for example, may be realized by an exclusive hardware.

Circuit information storage unit 170 stores predetermined circuit information 1701. Circuit information 1701 is a printed-circuit board or IC package information, and for example, is the information of characteristics of an element, arrangement of an element, and a trace of interelements and the like mounted on the printed-circuit board or the IC package.

Allowable value information storage unit 180 stores predetermined allowable power-supply voltage fluctuation value 1801. Allowable power-supply voltage fluctuation value 1801 is an allowable fluctuation value to a rated value of a power-supply voltage. Specifically, for example, when the rated value of the power-supply voltage is 1.5 v and the allowed fluctuation is 5%, the allowed fluctuation value is 1.5 v×0.05=0.075 v.

Circuit information storage unit 170 and allowable value information storage unit 180 use a network communications circuit not shown in the Figure and compose a database system by being connected mutually. Further, circuit information storage unit 170 and allowable value information storage unit 180 may respectively be an external server, a disk array, or an internal disk device of a computer and the like realizing power integrity analyzer 110. Moreover, circuit information storage unit 180 and allowable value information storage unit 180 may respectively be implemented individually or implemented together.

Power integrity analyzer 110 includes parameter input unit 120, conversion unit 130, impedance calculation unit 140, analysis unit 150, and result display unit (also called as output unit) 160.

Figure 3:
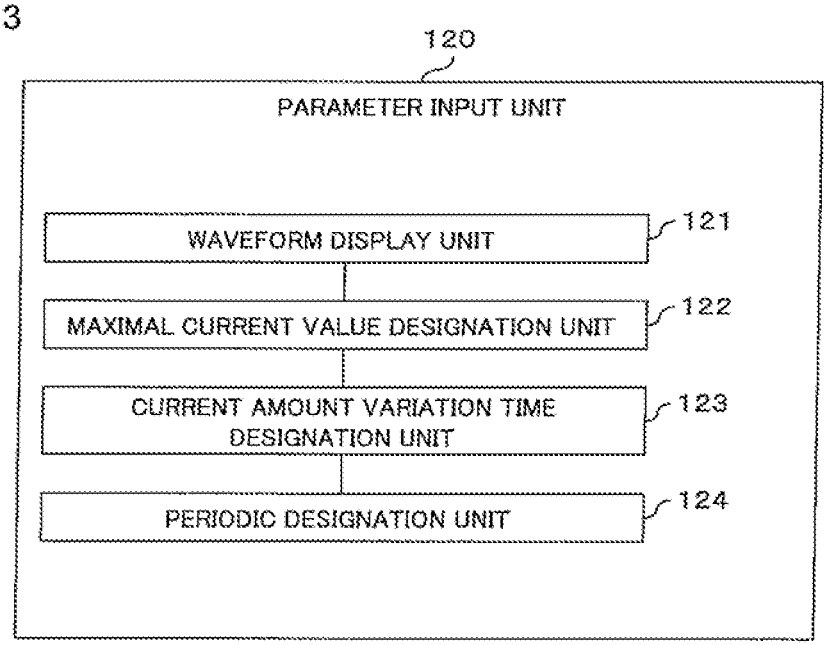
FIG. 3 is a block diagram showing a composition of a parameter input unit of the first exemplary embodiment.

FIG. 3 is a block diagram showing a composition inside parameter input unit 120. Referring to FIG. 3, parameter 120 includes waveform display unit 121, maximal current value designation unit 122, current amount variation time designation unit 123, and periodic designation unit 124.

Next, operation of the exemplary embodiment will be described in detail referring to FIG. 1 to FIG. 9.

First, a series of operation of power integrity analyzer 110 will be described based on the flowchart shown in FIG. 8.

Figure 8:
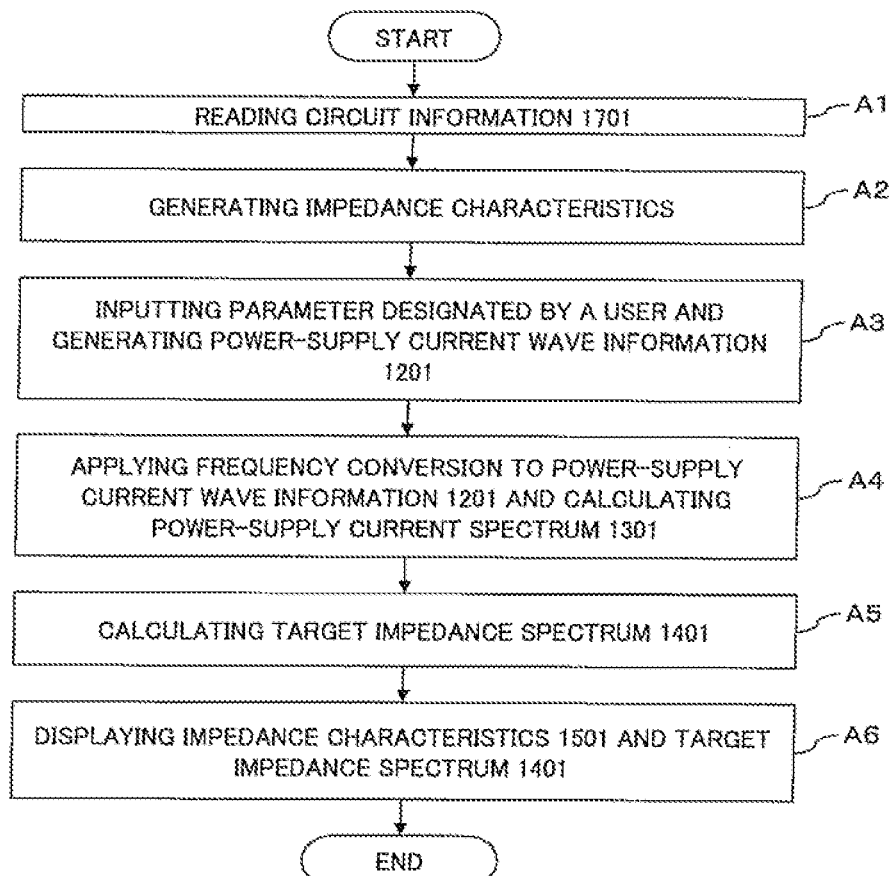
FIG. 8 is a flowchart showing operation of an analyzing unit of the first exemplary embodiment.

Analysis unit 150 reads circuit information 1701 from circuit information storage unit 170 (step A1 of FIG. 8). Subsequently, analysis unit 150 runs an impedance analysis based on the read circuit information 1701 and generates impedance characteristics data (hereinafter, simply referred to as impedance characteristics) 1501 (step A2 of FIG. 8).

Parameter input unit 120 inputs parameters designated by a user to after-mentioned power-supply current waveform 1211 and generates power-supply current wave information 1201 as shown in FIG. 4 (step A3 of FIG. 8).

Next, conversion unit 130 applies frequency conversion to power-supply current waveform 1211 on a time axis based on power-supply current wave information 1201, and calculates power-supply current spectrum information (hereinafter, simply referred to as power-supply current spectrum) 1301 as shown in FIG. 5 (step A4 of FIG. 8).

Next, impedance calculation unit 140 calculates target impedance spectrum 1401 as shown in FIG. 6 based on allowable power-supply voltage fluctuation value 1801 and power-supply current spectrum 1301 read from allowable value information storage unit 180 (step A5 of FIG. 8).

Next, result display unit 160 receives impedance characteristics 1501 and target impedance spectrum 1401 and displays on a display unit (for example, an input-output device such as a display which is not shown in the Figure) (Step A6 of FIG. 8).

Next, operation of parameter input unit 120 (FIG. 3) of step A3 of FIG. 8 will be described in detail.

Figure 9:
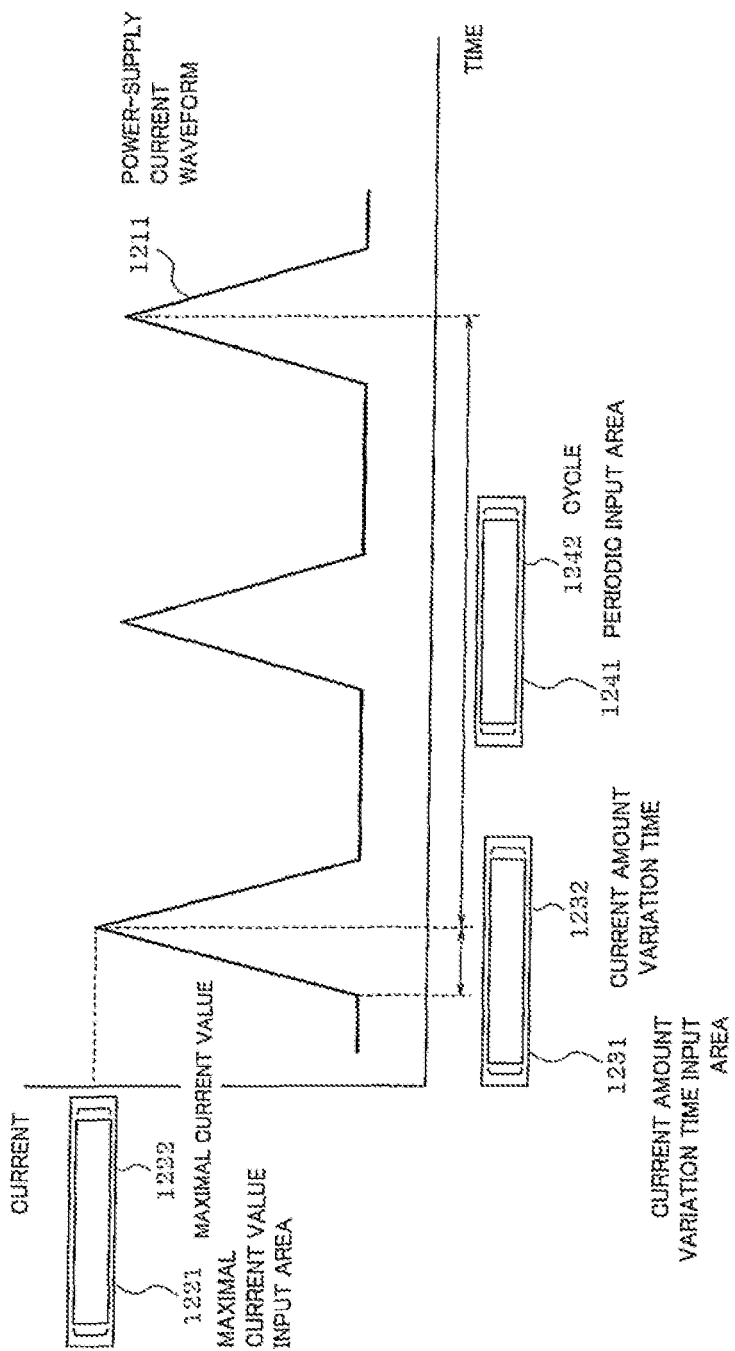
FIG. 9 is a display example of an operation entry screen of the first exemplary embodiment.

FIG. 9 is a diagram showing a display example of an operation entry screen (also called as input unit) displayed at a display unit by parameter input unit 120.

Waveform display unit 121 displays predetermined power-supply current waveform 1211 representing power-supply current variation on a time axis, on the above-mentioned operation entry screen. In the present exemplary embodiment, power-supply current waveform 1211 is a waveform that an identical triangular wave will occur at a regular interval.

Next, maximal current value designation unit 122 displays maximal current value input area 1221 on the screen of the above-mentioned operation entry screen. Then, by a user's operation, maximal power-supply current value designation unit 122 receives maximal power-supply current value (also called as the maximal value) 1222 inputted to maximal power-supply current value input area 1221 as one parameter of power-supply current waveform 1211.

Next, current amount variation time designation unit 123 displays current amount variation time input area 1231 to the above-mentioned operation entry screen. Then, by a user's operation, current amount variation time designation unit 123 receives current amount variation time (also called as variation time) 1232 which is inputted to current amount variation time input area 1231 as one parameter of power-supply current waveform 1211.

Finally, periodic designation unit 124 displays periodic input area 1241 to the above-mentioned operation entry screen. Then, by an operation of a user, periodic designation unit 124 receives cycle 1242 which is inputted to periodic input area 1241 as one parameter of power-supply current waveform 1211.

Figure 10:
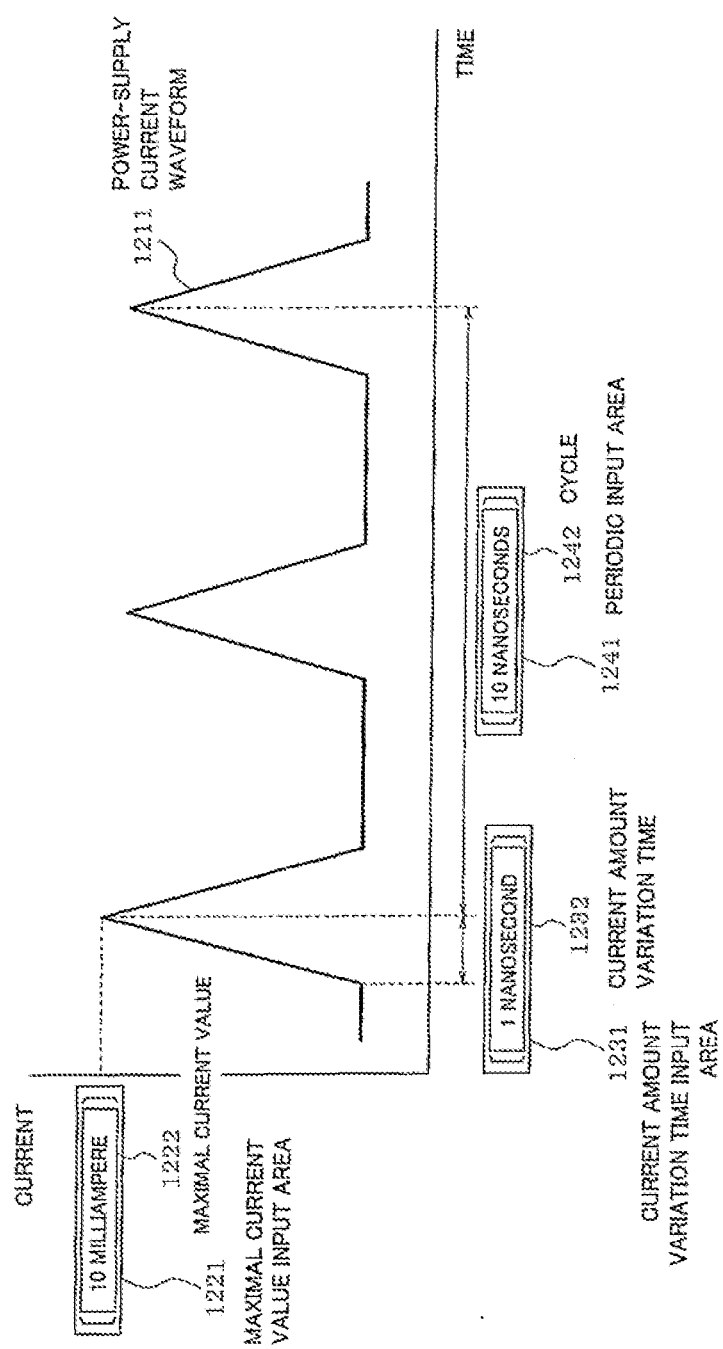
FIG. 10 is a display example of an operation entry screen of the first exemplary embodiment.

Next, operation of conversion unit 130 in step A4 of FIG. 8 will be described. The case of having various parameter values to power-supply current waveform 1211 as shown in FIG. 10 inputted by parameter input unit 120 will be described as an example.

Conversion unit 130 applies frequency conversion to power-supply current waveform 1211 on a time axis indicated by using power-supply current waveform information 1201. Conversion unit 130 performs frequency conversion by using each parameter of maximal current value 1222, current amount variation time 1232, and cycle 1242. Power-supply current wave information 1201 in the example shown in FIG. 10 and FIG. 4 is as follows.

First, to a steady-state power-supply current value, the power-supply current waveform includes an isosceles triangular wave having double time of current amount variation time 1232 as a base and having maximal current value 1222 as a height. The isosceles triangular wave occurs twice at equal intervals in the period of cycle 1242. The steady-state power-supply current value is predetermined 2 milliampere. Based on maximal current value 1222 (10 milliampere in the example shown in FIG. 10), the height of the isosceles triangle is also the same 10 milliampere. Based on current amount variation time 1232 (1 nanoseconds in the example shown in FIG. 10), the base of the isosceles triangle is 2 nanoseconds, the double time of current amount variation time 1232. An isosceles triangular wave cycle is 5 nanoseconds, on the basis of occurring twice at equal intervals in the period of cycle 1242 (10 nanoseconds in the example shown in FIG. 10). Based on cycle 1242 (10 nanoseconds in the example shown in FIG. 10), the cycle is also the same 10 nanoseconds.

The above-mentioned frequency conversion by conversion unit 130 is, for an example, a Fourier conversion. As a result of the above-mentioned frequency conversion, conversion unit 130 calculates power-supply current spectrum 1301 (FIG. 5) which waveform on a time axis is converted to a frequency spectrum.

Next, operation of impedance calculation unit 140 in step A5 of FIG. 8 will be described in detail.

Target impedance spectrum 1401, for example, can be found from the following formula.

target impedance spectrum=allowable power-supply voltage fluctuation value/power-supply current spectrum For example, when a power-supply voltage is 1.5 volt and a fluctuation within 5% of the power-supply voltage is allowable, allowable power-supply voltage fluctuation value 1801 is 1.5 volt×0.05=0.075 volt. Moreover, for example, when power-supply current corresponding to 100 megahertz out of power-supply current spectrum 1301 is 10 milliampere, an element of target impedance spectrum 1401 corresponding to 100 megahertz is as follows.

0.075 volt/0.01 ampere=7.5 ohm

Figure 2:
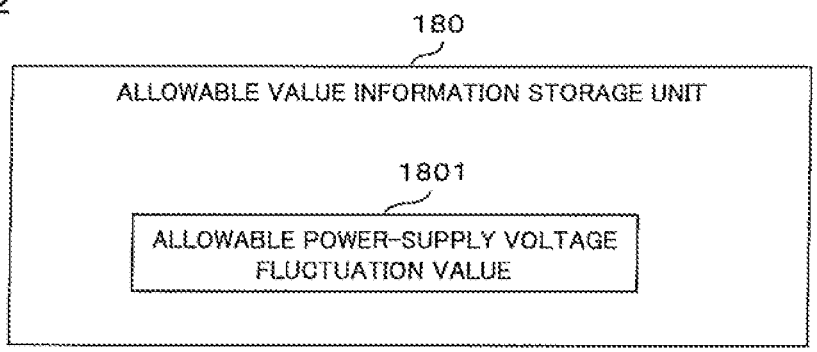
FIG. 2 is a block diagram showing a structure of an allowable power-supply voltage fluctuation value in the first to a third exemplary embodiment.

Further, the content that allowable value information storage unit 180 stores may be allowable power-supply voltage fluctuation value 1801 which has an unique value ranging in the entire frequency as shown in FIG. 2 from the description mentioned above, or it may be allowable power-supply voltage fluctuation spectrum 1802 which is differed by each frequency as shown in FIG. 7. When the content which the allowable value information storage unit 180 stores is allowable power-supply voltage fluctuation spectrum 1802, target impedance spectrum 1401, for example, can be found by the following formula.

target impedance spectrum=allowable power-supply voltage fluctuation spectrum/power-supply current spectrum The advantageous effect of the above-mentioned exemplary embodiment is that even when it is not possible to obtain actual measurement information or detailed operation characteristics information of LSI or a semiconductor chip, it is possible to calculate appropriate target impedance.

This is because a parameter input unit inputs parameters corresponding to power-supply current waveform on a designated time axis by a simple input by a user, a conversion unit converts the parameter to a power-supply current spectrum on a frequency axis, and an impedance calculation unit calculates target impedance based on the power-supply current spectrum.

Next, a second exemplary embodiment will be described in detail referring to the drawings.

Figure 11:
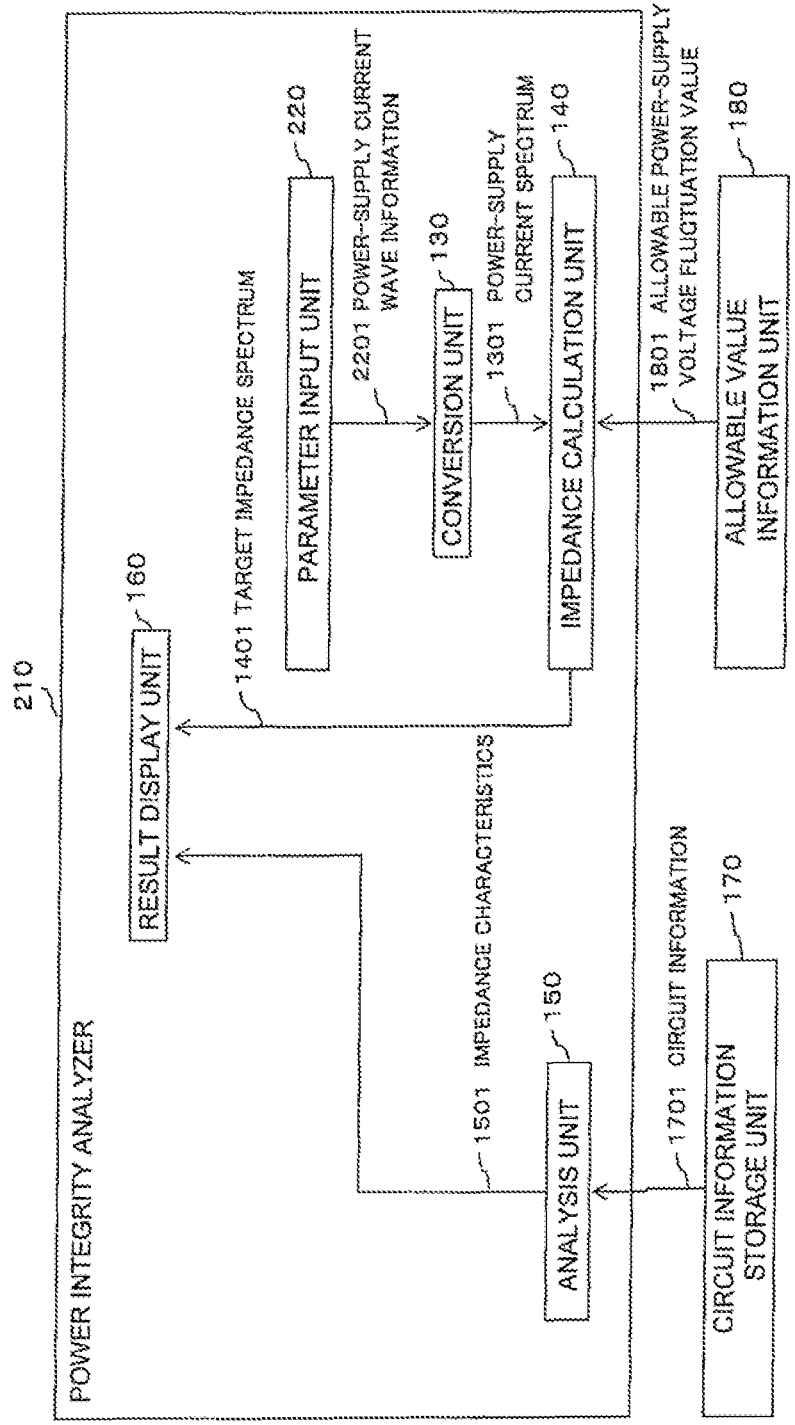
FIG. 11 is a block diagram showing a composition of a second exemplary embodiment.

FIG. 11 is a block diagram showing a composition of power integrity analysis system 102 according to the second exemplary embodiment.

Referring to FIG. 11, power integrity analyzer 210 includes parameter input unit 220 instead of parameter input unit 120, compared with the one in the first exemplary embodiment.

Figure 12:
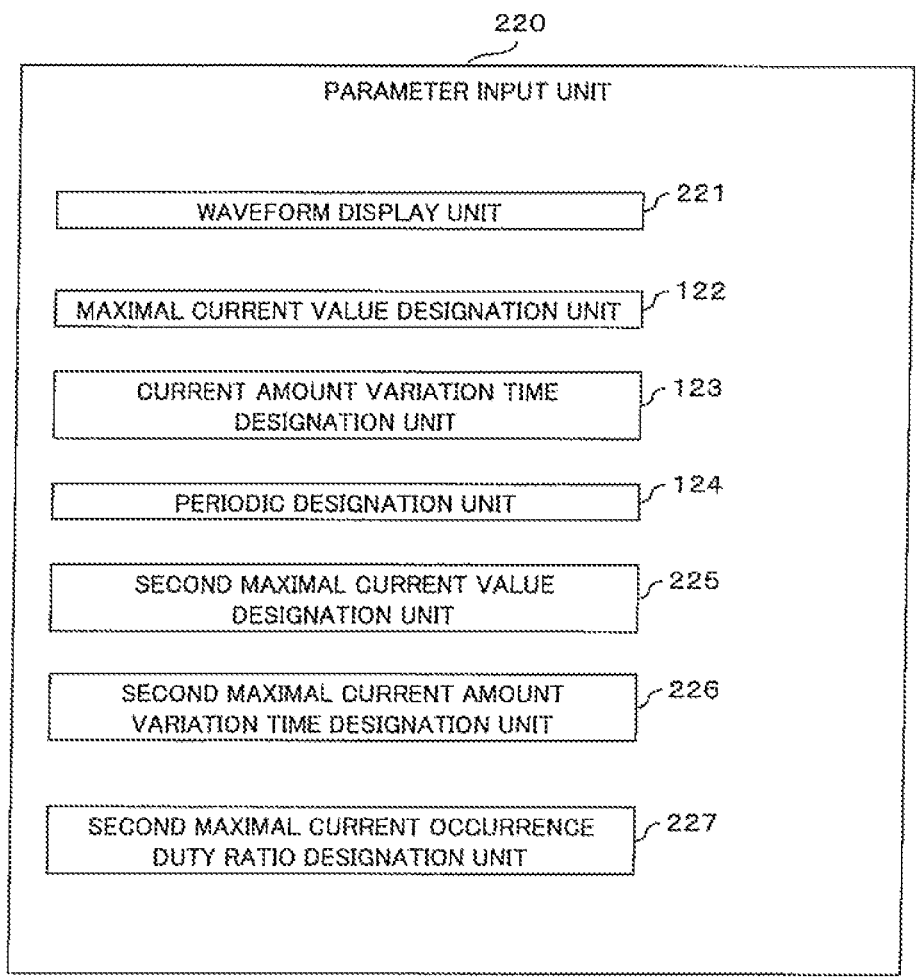
FIG. 12 is a block diagram showing a composition of a parameter input unit of the second exemplary embodiment.

FIG. 12 is a block diagram showing a composition of the inside of parameter input unit 220. Referring to FIG. 12, parameter input unit 220 differs from parameter input unit 120 of the first exemplary embodiment in the following points. First, waveform display unit 121 is changed to waveform display unit 221. Further, second maximal current value designation unit 225, second maximal current amount variation time designation unit 226, and second maximal current occurrence duty ratio designation unit (also called as time relation designation unit) 227 are added.

Compared to the operation of power integrity analyzer 110 of the first embodiment shown in FIG. 8, step A3 and step A4 in FIG. 8 is varied as follows as a series of operation of power integrity analyzer 210 in the present exemplary embodiment.

Parameter input unit 220 inputs parameters designated by a user to after-mentioned power-supply current waveform 2211, and generates power-supply current wave information 2201 as shown in FIG. 15 (operation corresponding to step A3 of FIG. 8).

Next, conversion unit 130 applies frequency conversion to power-supply current waveform 2211 on a time axis based on power-supply current wave information 2201, and calculates power-supply current spectrum 1301 as shown in FIG. 5 (operation corresponding to step A4 of FIG. 8).

Next, the different points from the first exemplary embodiment on operation of parameter input unit 220 in step A3 of FIG. 8 will be described in detail.

FIG. 13 is a diagram showing a display example of operation entry screen displayed to a display unit (not shown in the Figure) by parameter input unit 220.

Waveform display unit 221 displays predetermined power-supply current waveform 2211 indicating power-supply current variation on a time axis on the above-mentioned operation entry screen. In the present exemplary embodiment, power-supply current waveform 2211 is a waveform including a first triangular wave having regular intervals and a second triangular wave including a constant delay to the first triangular wave. Further, the interval from the occurrence of the first triangular wave and to the occurrence of the second triangular occurrence is smaller than the interval the first triangular wave generates, and the maximal current amount of the first triangular wave is larger than the maximal current amount of the second triangular wave.

Next, second maximal current value designation unit 225 displays second maximal current value input area 2251 to the above-mentioned operation entry screen. Then, by a user's operation, second maximal current value designation unit 225 receives second maximal current value 2252 inputted thereto as one parameter to power-supply current waveform 1211.

Next, second maximal current amount variation time designation unit 226 displays second maximal current amount variation time input area 2261 to the above-mentioned operation entry screen. Then, by a user's operation, second maximal current amount variation time designation unit 226 receives second maximal current amount variation time 2262 inputted thereto as one parameter of power-supply current waveform 1211.

Second maximal current occurrence duty ratio designation unit 227 displays second maximal current occurrence duty ratio input area 2271 to the above-mentioned operation entry screen. Then, by a user's operation, second maximal current occurrence duty ratio designation unit 227 receives second maximal current occurrence duty ratio 2272 inputted thereto as one parameter to power-supply current waveform 1211.

Next, operation of conversion unit 130 in step A4 of FIG. 8 will be described. The case that parameters for power-supply current waveform 2211 as shown in FIG. 14 was input into by parameter input unit 220 will be described as an example.

Conversion unit 130 applies frequency conversion to a waveform on a time axis as is the case with the first exemplary embodiment, and as a result calculates power-supply current spectrum 1301 which is a waveform on the time axis converted to a frequency spectrum.

Further, the waveform on the time axis which conversion unit 130 applies frequency conversion to is a waveform in which a first isosceles triangular wave occurs in cycle 1242, and a second isosceles triangular wave occurs after a delay time of the product of second maximal current occurrence duty ratio 2272 and cycle 1242. Furthermore, the first isosceles triangle has double time of current amount variation time 1232 as a base, and has maximal current value 1222 as a height. Moreover, the second isosceles triangle has double time of second maximal current amount variation time 2262 as a base, and has second maximal current value 2252 as a height.

For example, referring to FIG. 14 and FIG. 15, power-supply current wave information 2201 includes information as follows. A steady-state power-supply current value is predetermined 2 milliampere. Based on maximal current value 1222 (in the example of FIG. 14, 10 milliampere), the height of the first isosceles triangular wave is 10 milliampere. Based on current amount variation time 1232, the base of the first isosceles triangular wave is 2 nanoseconds, the double time of current amount variation time 1232 (in the example of FIG. 14, 1 nanosecond). Based on cycle 1242 (in the example of FIG. 14, 10 nanoseconds), the first isosceles triangular wave cycle is 10 nanoseconds. Based on second maximal current value 2252 (in the example of FIG. 14, 4 milliampere), the height of the second isosceles triangular wave is also the same 4 milliampere. Based on second maximal current amount variation time 2262 (in the example of FIG. 14, 1 nanosecond), the base of the second isosceles triangular wave is 2 nanoseconds, the double time of second maximal current amount variation time 2262. Based on cycle 1242 (in the example of FIG. 14, 10 nanoseconds) and second maximal current occurrence duty ratio 2272, the delay of the second isosceles triangular wave is 5 nanoseconds. Based on cycle 1242 (in the example of FIG. 14, 10 nanoseconds), the cycle is also the same 10 nanoseconds.

The advantageous effect of the above-mentioned exemplary embodiment, as in the first exemplary embodiment, is that even when it is not possible to obtain actual measurement information or detailed operation characteristics information of LSI or a semiconductor chip, it is possible to calculate appropriate target impedance.

This is because a parameter input unit inputs parameters corresponding to power-supply current waveform on a designated time axis by a simple input by a user, a conversion unit converts the parameter to a power-supply current spectrum on a frequency axis, and an impedance calculation unit calculates target impedance based on the power-supply current spectrum.

Next, a third exemplary embodiment will be described in detail referring to the drawings.

Figure 16:
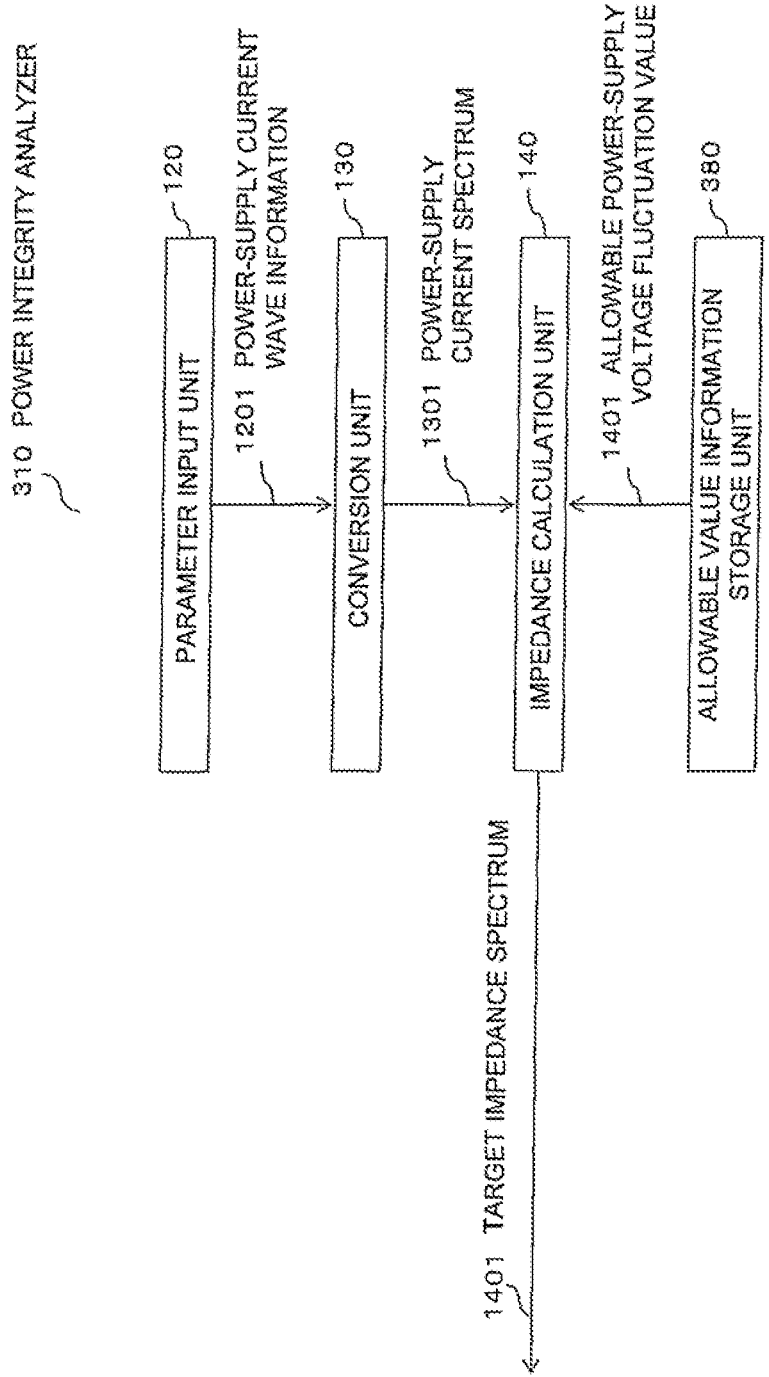
FIG. 16 is a block diagram showing a composition of a third exemplary embodiment.

FIG. 16 is a block diagram showing a composition of power integrity analyzer 310 according to the third exemplary embodiment.

Referring to FIG. 16, the present exemplary embodiment includes parameter input unit 120, conversion unit 130, allowable value information storage unit 380 and impedance calculation unit 140.

Parameter input unit 120 inputs parameter to a power-supply current wave form on a time axis of a specific element (for example, LSI).

Based on power-supply current wave information 1201 determined by above-mentioned parameters, conversion unit 130 converts power-supply current waveform 1211 on a time axis to power-supply current spectrum 1301 on a frequency axis.

Allowable value information storage unit 380, as allowable value information storage unit 180 shown in FIG. 2, stores allowable power-supply voltage fluctuation value 1801 of the specific element. Further, allowable value information storage unit 380, as allowable value information storage unit 180, may store allowable power-supply voltage fluctuation spectrum 1802 of the specific element.

Based on power-supply current spectrum 1301 and allowable power-supply voltage fluctuation value 1801, impedance calculation unit 140 calculates target impedance spectrum 1401 of the specific element. Further, based on power-supply current spectrum 1301 and allowable power-supply voltage fluctuation spectrum 1802, impedance calculation unit 140 may calculate target impedance spectrum 1401 of the specific element.

The advantageous effect of the above-mentioned exemplary embodiment, as in the first exemplary embodiment, is that even when it is not possible to obtain actual measurement information or detailed operation characteristics information of LSI or a semiconductor chip, it is possible to calculate appropriate target impedance.

This is because a parameter input unit inputs parameters corresponding to a power-supply current waveform on a designated time axis by a simple input by a user, a conversion unit converts the parameter to a power-supply current spectrum on a frequency axis, and an impedance calculation unit calculates target impedance based on the power-supply current spectrum.

Further, the exemplary embodiment described above can be applied to any waveform without limiting to the power-supply current waveform indicated in the examples of the above-mentioned exemplary embodiments respectively.

Of each composition element described in the above-mentioned each exemplary embodiment, for example, the predetermined process may be carried out by a computer. Moreover, the program carrying out the predetermined process may be stored in a storage medium.

The present invention is applicable to purposes such as power integrity design for print-circuit board or power integrity analysis of an IC package.

The whole or part of the exemplary embodiments disclosed above can be described as, but not limited to, the following supplementary notes.

(Supplementary Note 1)

A power integrity analyzer includes parameter inputting means for inputting parameters to power-supply current waveform which indicates a variation of power-supply current value on a time axis of an element; conversion means for converting power-supply current waveform which indicates a variation on the time axis determined by the parameter to power-supply current spectrum which indicates a variation of power-supply current value on a frequency axis; an allowable value information storage unit for storing an allowable power-supply voltage fluctuation value of the element; and impedance calculating means for calculating a target impedance spectrum on the device indicating the variation of impedance value on the frequency axis based on the power-supply current spectrum and the allowable power-supply voltage fluctuation value.

The issue that the present invention intends to resolve is supplemented below.

In the art disclosed in the related art documents, there is a problem that it is difficult to calculate appropriate impedance when performing power integrity analysis in an initial stage of an apparatus design.

The reasons for the appropriate target impedance calculation being difficult are as follows.

First, for example, in case obtaining the target impedance with applying the method disclosed in document 1 as indicated by document 2, when an input signal or a performance pattern varies, consumption current will also vary accordingly in LSI. However, it is difficult for an apparatus designer to assume such variation of the power-supply current value of LSI.

Further, for example, it is possible to calculate target impedance by having actual measurement using an object element as indicated by document 3. However, it may not always be expected to get an actual target LSI when having power integrity analysis of an apparatus design at an initial stage.

Further, as indicated by document 2 or document 4, it is possible to calculate target impedance by performing a simulation based on composition of LSI chip or IC package and on characteristics information. However, it cannot always be expected to have sufficient information necessary for the simulation, for example the voltage fluctuation spectrum of document 2 or the power-supply behavior of switching in active circuit element of integrated circuit device in document 4.

The present invention includes advantageous effect of having the calculation of appropriate target impedance possible even when it is impossible to obtain actual measurement information or detailed operation characteristics information on LSI or semiconductor chip.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A power integrity analyzer comprising:
   a parameter inputting unit that inputs parameters to corresponding a power-supply current waveform which indicates a variation of a power-supply current value on a time axis of an element;
   a conversion unit that converts the power-supply current waveform which indicates a variation of the power-supply current value on the time axis determined by the parameter to a power-supply current spectrum which indicates a variation of the power-supply current value on a frequency axis;
   an allowable value information storage unit that stores an allowable power-supply voltage fluctuation value of the element; and
   an impedance calculating unit that calculates a target impedance spectrum of the element which indicates the variation of impedance value on the frequency axis based on the power-supply current spectrum and the allowable power-supply voltage fluctuation value, wherein the parameter inputting unit comprising:
   a waveform display unit that displays the predetermined current waveform which indicates a variation of the power-supply current value on the time axis;
   a maximal current value designation unit that inputs a maximal value of the power-supply current in the current waveform as the parameter;
   a current value variation time designation unit that inputs a variation time necessary for a variation from a steady-state value of the power-supply current in the current waveform to the maximal value; and
   a periodic designation unit that inputs cycle corresponding to an operation clock of the element as the parameter.

2. The power integrity analyzer according to claim 1, wherein
   the maximal current value designation unit inputs a plurality of the maximal value of the power-supply current and the current value variation time designation unit inputs the variation time corresponding to the maximal values; and
   comprising a time relation designation unit that inputs the relation between the occurrence times of a plurality of the maximal value of the power-supply current in the current waveform as the parameter from the operation entry screen.

3. The power integrity analyzer according to claim 1, comprising:
   plural sets of the current value variation time designation unit corresponding to the maximal current value designation unit and the maximal current value designation unit; and
   a time relation designation unit that inputs the relation of the occurrence time of a plurality of the maximal values of the power-supply current in the current waveform.

4. The power integrity analyzer according to claim 1, wherein
   the impedance calculation unit calculates the value of the allowable power-supply voltage variation value divided by the power-supply current spectrum and calculates the result as the target impedance spectrum.

5. The power integrity analyzer according to claim 1, wherein
   the allowable power-supply voltage fluctuation value is an allowable power-supply voltage variation spectrum; and
   the impedance calculation unit calculates a voltage value of each frequency in the allowable power-supply voltage variation spectrum divided by a current value of each frequency in the allowable power-supply current spectrum and calculates the result as an impedance value of the corresponding each frequency in the target impedance spectrum.

6. The power integrity analyzer according to claim 1, comprising:
   an analysis unit, based on circuit information of a circuit including the element, that analyzes the circuit, and calculates impedance characteristics of the circuit; and
   a result display unit that displays the impedance characteristics and the target impedance.

7. A power integrity analysis method using a power integrity analyzer, said method comprising:
   inputting a parameter corresponding to a power-supply current waveform which indicates a variation of a power-supply current value on a time axis of an element from an input unit;
   converting the power-supply current waveform which indicates a variation of the power-supply current value on the time axis determined by the parameter to a power-supply current spectrum indicating a variation of the power-supply current value on a frequency axis;
   storing an allowable power-supply voltage fluctuation value of the element in a storage unit in advance; and
   calculating a target impedance spectrum of the element which indicates the variation on impedance value on the frequency axis based on the power-supply current spectrum and the allowable power-supply voltage fluctuation value, wherein said inputting the parameter comprising:
   displaying the predetermined current waveform which indicates a variation of the power-supply current value on the time axis on an operation entry screen;
   inputting a maximal value of the power-supply current in the current waveform as the parameter;

inputting a variation time necessary for variation from a steady-state value of the power-supply current in the current waveform to the maximal value as the parameter; and inputting a cycle corresponding to an operation clock of the element as the parameter.

8. The power integrity analysis method using a power integrity analyzer according to claim 7, said method further comprising:

inputting a plurality of the maximal value of the power-supply current in the inputting the maximal value of the current;

inputting the variation times corresponding to the maximal values in the current waveform in the inputting the variation time; and inputting the relation between the occurrence times of a plurality of the maximal value of the power-supply current in the current in the current waveform as the parameter.

9. The power integrity analysis method using a power integrity analyzer according to claim 7, said method further comprising:

calculating the result of dividing the allowable power-supply voltage fluctuation value by the power-supply current spectrum as the target impedance spectrum.

10. The power integrity analysis method using a power integrity analyzer according to claim 7, wherein the allowable power-supply voltage fluctuation value is an allowable power-supply voltage variation spectrum, and said method further comprising:

calculating a voltage value of each frequency in the allowable power-supply voltage variation spectrum divided by a current value of each frequency in the allowable power-supply current spectrum; and calculating the result as an impedance value of the corresponding each frequency in the target impedance spectrum, when calculating the target impedance spectrum.

11. The power integrity analysis method using a power integrity analyzer according to claim 7, wherein the output unit is a display unit, and said method further comprising:

based on circuit information of a circuit included in the element, analyzing the circuit, and calculating impedance characteristics of the circuit; and causing the impedance characteristics and the target impedance to be displayed by the display unit.

12. A non-transitory recording medium recording a program having the computer to implement, wherein it is a program having the computer to implement:

an input process that inputs a parameter to a power-supply current waveform which indicates variation of a power-supply current value on a time axis of an element from an input unit;

a conversion process that converts the power-supply current waveform which indicates a variation of the power-supply current value on the time axis determined by the parameter to a power-supply current spectrum which indicates a variation of the power-supply current value on a frequency axis;

a storage process that stores an allowable power-supply voltage fluctuation value of the element in a storage unit in advance; and a calculation process that calculates a target impedance spectrum of the element which indicates the variation of impedance value on the frequency axis based on the power-supply current spectrum and the allowable power-supply voltage fluctuation value, wherein the input process includes:

a waveform display process that displays the predetermined current waveform which indicates a variation of the power-supply current value on the time axis, on an operation entry screen;

a maximal current value designation process that inputs a maximal value of the power-supply current of the current waveform as the parameter, from the operation entry screen;

a current value variation time designation process that inputs a variation time necessary for a variation from a steady-state value of the power-supply current of the current waveform to the maximal value, from the operation entry screen; and a periodic designation process that inputs cycle corresponding to an operation clock of the element as the parameter, from the operation entry screen.

13. The non-transitory medium according to claim 12, wherein in the input process:

a plurality of the maximal value of the power-supply current is inputted when having the maximal current value designation process, as well as the variation time corresponding to the maximal values is inputted when having the power-supply current value variation time designation process; and the program has a computer to implement a time relation designation process that inputs the relation of an occurrence time among a plurality of the maximal value of the power-supply current in the current waveform, from the operation entry screen.

14. The non-transitory medium according to claim 12, wherein the result of the allowable power-supply voltage fluctuation value divided by the power-supply current spectrum is calculated as the target impedance spectrum in the calculation process.

15. The non-transitory medium according to claim 12, wherein the allowable power-supply voltage fluctuation value is an allowable power-supply voltage fluctuation spectrum; and in the calculation process, the result of dividing with a current value of each frequency corresponding to in the power-supply current spectrum, calculates a voltage value of each frequency in the allowable power-supply voltage variation spectrum as an impedance value of the corresponding each frequency in the target impedance spectrum.

16. The non-transitory medium according to claim 12, wherein the output unit is a display unit; and the program have a computer to implement;

an analysis process that based on circuit information of a circuit including the element analyzes the circuit, and calculates impedance characteristics of the circuit; and a result display process that displays the impedance characteristics and the target impedance on the display unit.

* * * * *